United States Patent [19]

Asars et al.

[11] Patent Number: 4,931,684
[45] Date of Patent: Jun. 5, 1990

[54] DIGITALLY SCANNED EXTENDED ELECTRON SOURCE IN VACUUM

[75] Inventors: Juris A. Asars, Murrysville Boro; Michael E. Colbaugh, Penn Township, both of Pa.

[73] Assignee: Westinghouse Electric Corp., Pittsburgh, Pa.

[21] Appl. No.: 289,099

[22] Filed: Dec. 23, 1988

[51] Int. Cl.$^5$ .............................................. H01J 1/02
[52] U.S. Cl. ........................................ 313/3; 313/306; 313/310; 313/325; 313/338; 324/541; 328/62
[58] Field of Search ...................... 313/359.1, 360.1, 3, 313/446, 104, 243, 270, 302, 306, 307, 310, 325, 338, 358; 324/541; 328/62, 76, 79, 82, 83

[56] References Cited

U.S. PATENT DOCUMENTS

| | | | |
|---|---|---|---|
| 3,096,478 | 7/1963 | Brown | 324/54 |
| 3,263,165 | 7/1966 | Eigen | 324/54 |
| 3,399,342 | 8/1968 | Fligel | 324/54 |
| 3,639,831 | 2/1972 | Cushman | 324/33 |
| 3,983,377 | 9/1976 | Vittins | 235/151.31 |
| 3,990,003 | 11/1976 | Agee, Jr. et al. | 324/52 |
| 3,991,363 | 11/1976 | Lathrop | 324/52 |
| 4,164,703 | 8/1979 | Boggs et al. | 324/54 |
| 4,249,124 | 2/1981 | DeMesmaeker | 324/51 |
| 4,313,169 | 1/1982 | Takagi et al. | 364/492 |

*Primary Examiner*—Kenneth Wieder

[57] ABSTRACT

A device is provided for detecting defects in wire or cable insulation which is located in a vacuum without disconnecting the cable by synchronously detecting the current in a sense conductor with respect to the potential waveform existing or imposed on the cable under test. A sense conductor and a scanned extended electron source having a linear cathode array are both placed in close proximity to and along the cable under test. Only a small portion of the cathodes in the linear array are excited at any one time and by placing the proper signals on the excitation conductors of the electron source, the electron generation scans or propagates along the entire length of the extended electron source. The current flowing in the sense conductor due to the electrons from the electron source varies depending upon the presence of defects in the cable insulation.

6 Claims, 1 Drawing Sheet

DIGITALLY SCANNED EXTENDED ELECTRON SOURCE IN VACUUM

FIELD OF THE INVENTION

The present invention relates to a device for detecting and pinpointing insulation defects in a wire or cable which is located in a vacuum. More particularly, the present invention relates to an electron source and a method for using it to detect insulation defects in a wire which is located in a vacuum environment such as is found in space.

BACKGROUND OF THE INVENTION

In many situations and circumstances, it is important to know if the insulation surrounding a wire or cable has deteriorated. These situations are not limited to those in an earth environment, but include satellites and space stations in the vacuum environment of space. Many of the devices and methods used to detect defects in electrically insulated wires cannot be used in the vacuum of space since they require the use of a conductive or semi-conductive gas which contains ions. See U.S. Pat. Nos. 3,096,478; 3,263,165; and 3,639,831.

It would be desirable, therefore, to have a localized source of electrons that can be positioned and electrically scanned along the length of an insulated cable which is located in a vacuum to assist in detecting and pinpointing defects in the insulation while the cable is operating.

SUMMARY OF THE INVENTION

Generally, the present invention relates to an extended electron source wherein the electron generation is scanned along the electron source so that the electron production propagates along the length of the electron source with only a small portion of the electron source generating electrons at any given time. This digitally stepped or scanned electron source can be used in many situations and devices. Preferably, it is used in a device for detecting defects in the insulation of a wire or cable which is located in a vacuum environment such as that found in space.

The extended electron source generally comprises a plurality of excitation conductors connected to a plurality of cathodes for generating electrons. The cathodes are spaced apart from one another, preferably by insulating spacers, and are arranged in a linear array along the length of the extended electron source. Preferably, there are four or more excitation conductors although an extended electron source can be made with three and possibly only two excitation conductors, however, the timing in these latter arrangements becomes much more difficult. Each excitation conductor is connected to several cathodes such that a regular pattern of connections is formed. For example, in one embodiment, the first four cathodes in the linear array would each be connected to one of the four excitation conductors. The second four cathodes would each be connected to one of the four excitation conductors, in the same order as the first four cathodes were. This pattern would then be repeated along the length of the extended electron source, with the result that adjacent cathodes are connected to different excitation conductors.

The extended electron source with the linear cathode array is preferably placed in close proximity to and along the wire or cable which is to be tested for insulation defects. A sense conductor is also located in close proximity to and along the cable under test so that the normal operation of the cable and the equipment to which it is attached is not interrupted by the test. The electron source is excited and a current flows from the electron source to the sense conductor. This current is affected by any defects which are present in the cable's insulation. By synchronously detecting or measuring the current in the sense conductor with respect to the potential waveform on the cable under test, it can be determined whether a defect is present in the insulation of the cable. This can easily be done by multiplying the sense conductor current measurement by the potential waveform on the cable under test and averaging the result over a period of time which is greater than the frequency of the potential or current waveforms. The synchronous detection of the sense conductor current with respect to the potential Waveform on the conductor enhances the signal to noise ratio of the sense conductor current measurement.

By scanning the electron source or digitally stepping along the length of the cathode array, the actual location of the defect in the cable can be determined. The position of the excited cathode in the cathode array at the time an insulation defect is detected, specifies the location of the insulation defect along the cable. Scanning also reduces the power required to operate the electron source. For a cathode in the array to generate electrons, it must be supplied with a pulse on its excitation conductor while at least one of its neighbors in the linear array is also generating electrons. If a cathode in the extended source is initially excited and the proper sequence of pulses is placed on the excitation conductors, the physical location of the electron generation can be stepped along the entire length of the electron source.

Other details, objects and advantages of the present invention will become more readily apparent from the following description of a presently preferred embodiment thereof.

BRIEF DESCRIPTION OF THE DRAWINGS

In the accompanying drawings, a preferred embodiment of the present invention is illustrated, by way of example only, wherein.

DESCRIPTION OF THE PREFERRED EMBODIMENT

Figure 1:
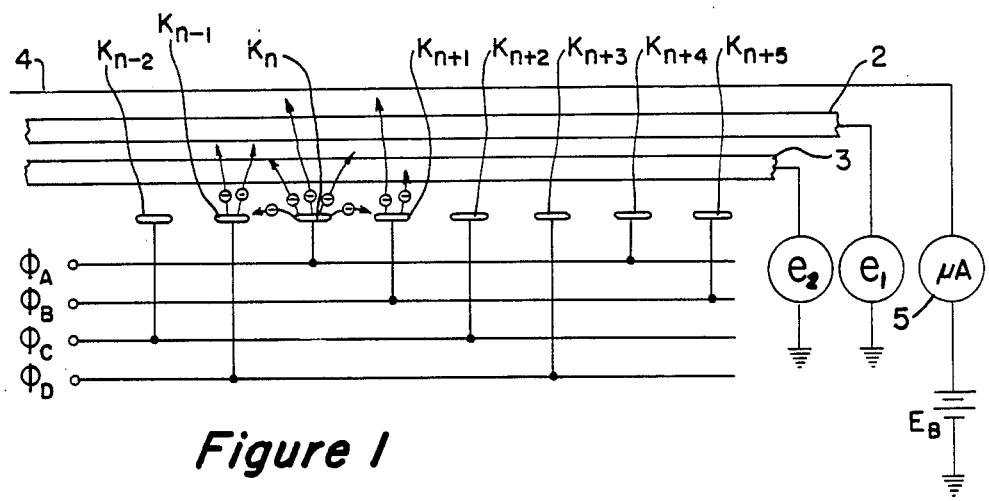
FIG. 1 shows a schematic of an electron source of the present invention used to detect insulation defects.

A schematic diagram of a scanned extended electron source 1 for detecting and pinpointing insulation defects in a cable which is located in a vacuum environment such as space is shown in FIG. 1. In this example there are two cables under test represented by the insulated conductors 2 and 3 which are in close proximity to the extended electron source 1. The cables are at their normal operating potentials $e_1$ and $e_2$ supplied by other than the insulation test equipment. A single sense conductor 4 has been placed in close proximity to and preferably along side the cables 2 and 3 so the normal operation of the cables is not interrupted by the insulation test procedure. The electron current from the electron source 1 to the sense conductor 4 is synchronously detected by current measuring instrument 5 with respect to each of the potential waveforms $e_1$ and $e_2$ on the cables to identify any defects in the cable insulation. By knowing the position of the active cathodes in the linear array of the extended electron source at the time a defect is detected, the location of that insulation defect along the length of the cable can be specified. Preferably, the linear cathode array is held at a negative potential with respect to the sense conductor 4. Also, the sensitivity of the measurement of the sense conductor current can be improved by connecting the sense conductor to a bias potential $E_B$.

Figure 2:
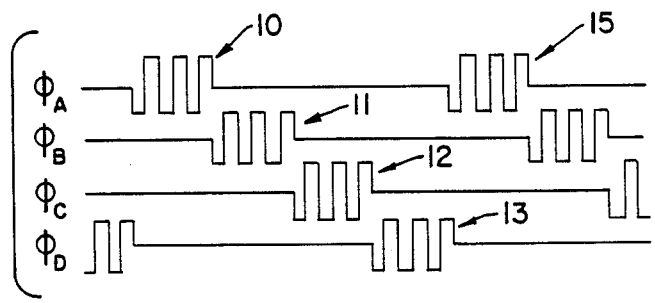
FIG. 2 shows the waveforms of a series of pulses which are used to drive the cathodes of the electron source shown in FIG. 1.

In one embodiment, the extended electron source comprises four excitation conductors $\phi_A$, $\phi_B$, $\phi_C$ and $\phi_D$ connected to a plurality of cathodes $K_{n-a}$ through $K_n$ through $K_{n+a}$ where a is an integer. Each cathode is connected to a different excitation conductor than its adjacent neighbors. One configuration is shown in FIG. 1 although other configurations are possible. The excitation conductors are activated by a series of pulses such as those shown in FIG. 2 which determine the position and movement direction of the localized electron generation.

The propagation of the electron generation can be explained as follows. Assume that at some point in time, while a series of drive pulses 10 is present on excitation conductor $\phi_A$, cathode $K_n$ is at a temperature above that of thermionic electron emission for the material used to form cathode $K_n$. During the negative going portions of the drive pulses 10, electrons emitted by cathode $K_n$ are accelerated toward cathodes $K_{n-1}$ and $K_{n+1}$ with a potential sufficient to heat those cathodes above the temperature at which thermionic electron emission begins. During the positive going portions of the drive pulses 10, electrons emitted by cathodes $K_{n-1}$ and $K_{n+1}$ are accelerated toward cathode $K_n$ and their energy loss maintains the temperature of cathode $K_n$ above its thermionic electron emission temperature.

As the drive pulses 10 on excitation conductor $\phi_A$ are terminated and the series of drive pulses 11 is initiated on excitation conductor $\phi_B$, the temperature of cathodes $K_n$ and $K_{n+1}$ is maintained above their thermionic electron emission temperature. However, cathode $K_{n-1}$ cools down due to lack of accelerating electrons between it and its neighbors, while the temperature of cathode $K_{n+2}$ is raised above its thermionic electron emission temperature due to the electron energy dissipated during negative going portions of the drive pulses 11 on excitation conductor $\phi_B$.

At the beginning of the next quarter period of the cathode drive pulse sequence, the drive pulses 11 are terminated on excitation conductor $\phi_B$ and drive pulses 12 are initiated on excitation conductor $\phi_C$. Cathode $K_n$ now cools down while the thermionic electron emission temperature of cathodes $K_{n+1}$ and $K_{n+2}$ is maintained and the temperature of cathode $K_{n+3}$ is raised above the temperature necessary to begin thermionic electron emission. During the last quarter period of the sequence, before a series of drive pulses is reapplied on excitation conductor $\phi_A$, the series of drive pulses 13 on excitation conductor $\phi_D$ maintains the electron emission from cathodes $K_{n+2}$, $K_{n+3}$, and $K_{n+4}$. As the series of drive pulses 15 is reapplied on excitation conductor $\phi_A$, cathode $K_{n+4}$ becomes the center of the electron emission and not cathode $K_n$ because at this time, both cathodes $K_{n-1}$ and $K_{n+1}$ have cooled down below the thermionic electron emission temperature.

The relative number of electrons that are emitted by each of the three active cathodes as well as the number of electrons that are escaping the linear array and flowing to the sense conductor can be controlled by the relative amplitudes and duty cycles of the positive and negative portions of the series of drive pulses. The maximum velocity of propagation of the localized electron cloud along the linear cathode array is determined by the thermal time constants.

While a presently preferred embodiment of practicing the invention has been shown and described with particularity in connection with the accompanying drawings, the invention may otherwise be embodied within the scope of the following claims.

What is claimed:

1. A scanned extended electron source comprising a plurality of excitation conductors connected to a plurality of cathodes for generating electrons, each cathode connected to only one excitation conductor such that an adjacent cathode is connected to a different excitation conductor, the cathodes being spaced apart and arranged in a linear array along the length of the extended electron source such that each excitation conductor in turn is activated by a series of pulses such that the generation of the electrons propagates along the extended electron source from one cathode to another.

2. A scanned extended electron source as described in claim 1 wherein the pulses are electrical pulses.

3. A scanned extended electron source as described in claim 2 wherein the electrical pulses are a series of square waves.

4. A scanned extended electron source as described in claim 1 wherein there are at least four excitation conductors.

5. A scanned extended electron source as described in claim 1 wherein the linear array of cathodes are spaced apart by a plurality of insulated spacers.

6. A scanned extended electron source as described in claim 1 wherein the excitation conductors and the linear array of cathodes form a cable.

* * * * *